(12) United States Patent
Kobayashi et al.

(10) Patent No.: US 6,509,776 B2
(45) Date of Patent: Jan. 21, 2003

(54) DLL CIRCUIT, SEMICONDUCTOR DEVICE USING THE SAME AND DELAY CONTROL METHOD

(75) Inventors: Shotaro Kobayashi, Tokyo (JP); Toru Ishikawa, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/828,002

(22) Filed: Apr. 6, 2001

(65) Prior Publication Data

US 2001/0028267 A1 Oct. 11, 2001

(30) Foreign Application Priority Data

Apr. 11, 2000 (JP) .......................................... 2000-109650

(51) Int. Cl.[7] .............................................. H03H 11/26
(52) U.S. Cl. ........................ 327/277; 327/158; 327/161; 327/284; 375/376; 331/DIG. 2
(58) Field of Search ......................... 327/141, 144–147, 327/148–151, 153, 155–160, 161, 162; 375/371, 373–376; 365/233, 233.5, 189.07; 331/DIG. 2, 11–12, 25, 1 A

(56) References Cited

U.S. PATENT DOCUMENTS 5,687,202 A * 11/1997 Eitrheim ..................... 375/376

| | | | | |
|---|---|---|---|---|
| 5,990,715 A | * | 11/1999 | Nishimura | 327/158 |
| 6,005,426 A | * | 12/1999 | Lin et al. | 327/158 |
| 6,066,969 A | * | 5/2000 | Kawasaki et al. | 327/156 |
| 6,208,183 B1 | * | 3/2001 | Li et al. | 327/161 |

FOREIGN PATENT DOCUMENTS

| JP | 10-209857 A | 8/1998 |
|---|---|---|
| JP | 11-127063 A | 5/1999 |

* cited by examiner

*Primary Examiner*—Timothy P. Callahan
*Assistant Examiner*—Minh Nguyen
(74) *Attorney, Agent, or Firm*—Choate, Hall & Stewart

(57) ABSTRACT

A DLL (delay locked loop) circuit includes a signal propagation system and a delay control system. The signal propagation system includes a delay circuit which delays a reference clock signal based on a delay control signal to generate a delayed clock signal. The delay control system includes a sampling circuit, a phase comparing circuit and a delay control circuit. The sampling circuit outputs a first clock signal having a pulse corresponding to one of n (n is an integer more than 1) pulses of the delayed clock signal. The phase comparing circuit compares the first clock signal as a first comparison input signal and the reference clock signal as a second comparison input signal in phase to output a phase difference. The delay control circuit generates the delay control signal based on the phase difference from the phase comparing circuit to output to the delay circuit of the signal propagation system.

5 Claims, 10 Drawing Sheets

DLL CIRCUIT, SEMICONDUCTOR DEVICE USING THE SAME AND DELAY CONTROL METHOD

BACKGROUND OF THE INVENTION

1. Field of the Invention

The present invention relates to a DLL circuit, a semiconductor device and a phase delay control method.

2. Description of the Related Art

The operation of a semiconductor device such as a memory circuit, an interface circuit, and a CPU is controlled based on a reference clock signal externally supplied. In recent years, with speed-up of the semiconductor device, it is required that a memory circuit can operate correctly at high speed in about 400 MHz. For example, a synchronous DRAM carries out data output in synchronism with the reference clock signal. Such a synchronous DRAM must operate correctly in synchronism with the rising edge and falling edge of the clock signal with about 2.5-ns period. In other words, this means that it is necessary for the memory circuit to operate at the timing of half period of 1.25 ns.

The operation of the synchronous DRAM is controlled by internal clock signals generated based on the reference clock signal. However, in order to guarantee a correct high-speed operation, it is necessary that the phase of the external clock signal as the reference clock signal and the phase of the internal clock signal are coincident with each other or the phase difference of the external clock signal and the internal clock signal is strictly controlled. For the purpose, a DLL circuit is used.

That is, a variable delay circuit delays the external clock signal and outputs as an internal clock signal from the DLL circuit. The phase of the internal clock signal generated in this way and the phase of the external clock signal are compared by the phase comparing circuit, and a feedback phase control is carried out based on the phase shift quantity and the delay quantity of the variable delay circuit is adjusted. In this way, the phase of the internal clock signal is made coincident with the phase of the external clock signal.

A conventional example of such a DLL circuit is known in Japanese Laid Open Patent Application (JP-A-Heisei 11-127063). The structure of this conventional example is shown in FIG. 1. Also, the operation is shown in FIGS. 2A to 2E. Referring to FIG. 1, the external clock signal is supplied to a variable delay circuit 103 as a signal N1 through an input buffer as shown in FIG. 2A. The variable delay circuit 103 delays the signal N1 based on a delay control signal N8 from a delay control circuit 107 to generate a signal N4 as shown in FIG. 2C. The signal N4 is outputted as the internal clock signal through an output buffer 109. Also, the signal N4 is supplied to a timing synchronizing circuit 101.

Also, the signal N1 is divided by a frequency divider 102 and is supplied to a phase comparing circuit 106 as the signal N2 as shown in FIG. 2D. The signal N2 is also supplied to a timing synchronizing circuit 101. The timing synchronizing circuit 101 outputs the signal N2 as the signal N5 in synchronism with the signal N4 as shown in FIG. 2D.

The signal N5 is supplied to the phase comparing circuit 106 as the signal N7 through an output dummy circuit 104 and an input dummy circuit 105 as shown in FIG. 2E. The phase comparing circuit 106 compares the signal N2 and the signal N7 in phase and outputs a phase difference to a delay control circuit 107. The delay control circuit 107 generates the delay control signal based on the phase difference from the phase comparing circuit 106 and outputs it to the variable delay circuit 103 as a signal N8.

The internal clock signal S4 which has been subjected to phase control in this way is used for the control of the timing at which read data is outputted from the output buffer 109, and is in synchronous with the reference clock signal IN. As above-mentioned, the operation frequency of the memory circuit is increased in recent years and the increase of the consumed power (average operating current) becomes a problem. Generally, in a logic circuit composed of CMOS transistors, the charging current and discharge current flow only when the data is switched, i.e., 0 and 1 of the data is switched. Therefore, it is the output buffer and an input buffer and an output dummy circuit and an input dummy circuit that consume the most of current in the DLL circuit of FIG. 1.

Therefore, in the conventional example shown in FIG. 1, the reference clock signal N1 is divided in frequency into ½ by the frequency divider 102, so that the number of times of the phase comparison operation is reduced to ½. Therefore, the number of times of the switching operation of the dummy circuit is suppressed to ½ and can reduce power consumption.

The operation of the timing synchronizing circuit 101 will be described with reference to FIG. 1. The timing synchronizing circuit 101 has a flip-flop circuit which inputs the signal N2 obtained by frequency-dividing the signal N1 (FIG. 2B) and the signal N4 (FIG. 2B) obtained by delaying the signal N1. The timing synchronizing circuit 101 generates the signal N5 (FIG. 2D) obtained by synchronizing a frequency-division signal of the signal N1 with the signal N4. FIGS. 2A to 2E show timing charts when the timing synchronizing circuit 101 operates normally.

However, the delay quantity from the variable delay circuit 103 changes in accordance with the phase difference between the signal N1 and the signal N4. Therefore, the timing synchronizing circuit 101 takes synchronization between the signals which have no relation substantively. For this reason, there is caused the state in which the signal N2 changes during a setup hold period of the flip-flop circuit of the timing synchronizing circuit 101, i.e., the state in which the rising edge of the signal N4 and the change point of the signal N2 are approximately coincident with each other. As a result, a meta-stable state is caused in which the output of data 1 and the outputs of data 0 balance so that a middle voltage is outputted. Consequently, an unstable operating state is caused such as delay of the rising timing of the signal N5 and the disappearance of a signal waveform.

The phase difference which causes such an erroneous operation occurs in the process of taking the synchronization of the signal N1 and the signal N4. However, it is generally difficult to design to operate the timing synchronizing circuit 101 stably in the wide frequency range.

In conjunction with the above description, a semiconductor integrated circuit with a phase comparing circuit is disclosed in Japanese Laid Open Patent Application (JP-A-Heisei 10-209857). In the semiconductor integrated circuit of this reference, a first control circuit frequency-divides a first signal into 1/n (n is an integer more than 1) in response to a third signal. A second control circuit frequency-divides a second signal into 1/n in response to the third signal. A phase comparing section compares the output signal of the first control circuit and the output signal of the second control circuit in phase.

SUMMARY OF THE INVENTION

Therefore, an object of the present invention is to provide a DLL circuit which can reduce the power consumption.

Another object of the present invention is to provide a DLL circuit which can operate stably even if the frequency of an external clock signal changes.

Still another object of the present invention is to provide a DLL circuit which can control the number of times of phase comparison.

Yet still another object of the present invention is to provide a DLL circuit which detects the phase of an input clock signal with respect to a delay signal and can guarantee a stable operation.

Also, another object of the present invention to provide a DLL circuit which can operates stably during a period from a time when the DLL circuit is started, namely, from an unlock state (the state that the phase difference between the external clock signal and the internal clock signal does not fall within a predetermined range) to the lock state (the state that the phase difference between the external clock signal and the internal clock signal falls within the predetermined range).

Still another object of the present invention is to provide a semiconductor device such as a synchronous DRAM which contains the above DLL circuit.

Yet still another object of the present invention is to provide a delay control method in the above DLL circuit.

In an aspect of the present invention, a DLL (delay locked loop) circuit includes a signal propagation system and a delay control system. The signal propagation system includes a delay circuit which delays a reference clock signal based on a delay control signal to generate a delayed clock signal. The delay control system includes a sampling circuit, a phase comparing circuit and a delay control circuit. The sampling circuit outputs a first clock signal having a pulse corresponding to one of n (n is an integer more than 1) pulses of the delayed clock signal. The phase comparing circuit compares the first clock signal as a first comparison input signal and the reference clock signal as a second comparison input signal in phase to output a phase difference.

The delay control circuit generates the delay control signal based on the phase difference from the phase comparing circuit to output to the delay circuit of the signal propagation system.

The signal propagation system may further include an input circuit which inputs an external clock signal as the reference clock signal to output to the delay circuit. In this case, the delay control system further includes an input dummy circuit which delays the first clock signal from the sampling circuit by a delay quantity corresponding to that of the input circuit to output to the phase comparing circuit as the first comparison Input signal.

Also, the signal propagation system may further include an output circuit which inputs the delayed clock signal from the delay circuit to output the delayed clock signal as an internal clock signal. In this case, the delay control system further includes an output dummy circuit which delays the first clock signal from the sampling circuit by a delay quantity corresponding to that of the output circuit to output to the phase comparing circuit as the first comparison input signal.

Instead, the signal propagation system may further include an input circuit which inputs an external clock signal to output to the delay circuit as the reference clock signal, and an output circuit which inputs the delayed clock signal from the delay circuit to output as the internal clock signal. In this case, the delay control system further includes a dummy circuit which delays the first clock signal from the sampling circuit by a delay quantity corresponding to a summation of a delay quantity of the input circuit and a delay quantity of the output circuit to output to the phase comparing circuit as the first comparison input signal.

Also, the phase comparing circuit may output the phase difference between the first comparison input signal and the second comparison input signal as with respect to a phase of the first comparison input signal. In this case, the phase comparing circuit may output as the phase difference, lead or delay of a phase in a rising edge of the second comparison input signal with respect to a phase in a rising edge of the first comparison input signal.

Also, the sampling circuit may include a frequency divider and a selection output circuit. The frequency divider divides a frequency of the delayed clock signal into 1/n to generate a division signal. The selection output circuit selectively outputs a pulse corresponding to each of the pulses of the delayed clock signal based on the division signal.

In this case, the selection output circuit may include a clocked inverter connected with an output of the frequency divider to invert the delayed clock signal, and an N-channel transistor having a gate terminal connected with an output of the frequency divider, a drain terminal connected with an output of the clocked inverter and a source terminal grounded.

Also, the frequency divider may include a flip-flop which divides the frequency of the delayed clock signal into ½, and an inverter which inverts an output of the flip-flop. Instead, the frequency divider may include a flip-flop which divides the frequency of the delayed clock signal into ½, and a NOR circuit which outputs a NOR operation result of an output of the flip-flop and a sampling control signal. In this case, the sampling control signal is in an L level normally and is in a H level in an active state, and indicates whether the delay signal should be outputted in synchronism with the division signal or continuously.

Also, the DLL circuit may further include a frequency divider which divides a frequency of the reference clock signal into 1/m (m is a divisor of n except for 1) and inverts and supplies to the phase comparing circuit as the second comparison input signal.

In another aspect of the present invention, a delay control method is attained by (a) generating a reference clock signal from an external clock signal supplied via an input buffer; by (b) delaying the reference clock signal based on a delay control signal to generate a delayed clock signal; by (c) outputting the delayed clock signal via an output buffer; by (d) sampling a pulse corresponding to one of n (n is an integer more than 1) pulses of the delayed clock signal to output a first clock signal; by (e) delaying the first clock signal by a summation of a delay quantity of the input buffer and a delay quantity of the output buffer to generate a second clock signal; by (f) comparing the second clock signal as a first comparison input signal and the reference clock signal as a second comparison input signal in phase to output a phase difference; and by (g) generating the delay control signal based on the phase difference.

Also, the (d) sampling step may be attained by dividing a frequency of the delayed clock signal into 1/n to generate a division signal; and by selectively outputting a pulse corresponding to each of the pulses of the delayed clock signal based on the division signal.

Also, the (f) comparing step may be attained by outputting the phase difference between the first comparison input signal and the second comparison input signal as with respect to a phase of the first comparison input signal.

Instead, the (f) comparing step may be attained by outputting lead or delay of a phase of a rising edge of the second comparison input signal as the phase difference with respect to a phase of a rising edge of the first comparison input signal.

Also, the delay control method may further include: dividing a frequency of the reference clock signal into 1/m (m is a divisor of n except for 1) to generate a frequency-divided clock signal; and inverting the frequency-divided clock signal to output as the second comparison input signal.

DESCRIPTION OF THE PREFERRED EMBODIMENTS

Hereinafter, a DLL circuit and a semiconductor memory device containing the same of the present invention will be described below in detail with reference to the attached drawings.

Figure 1:
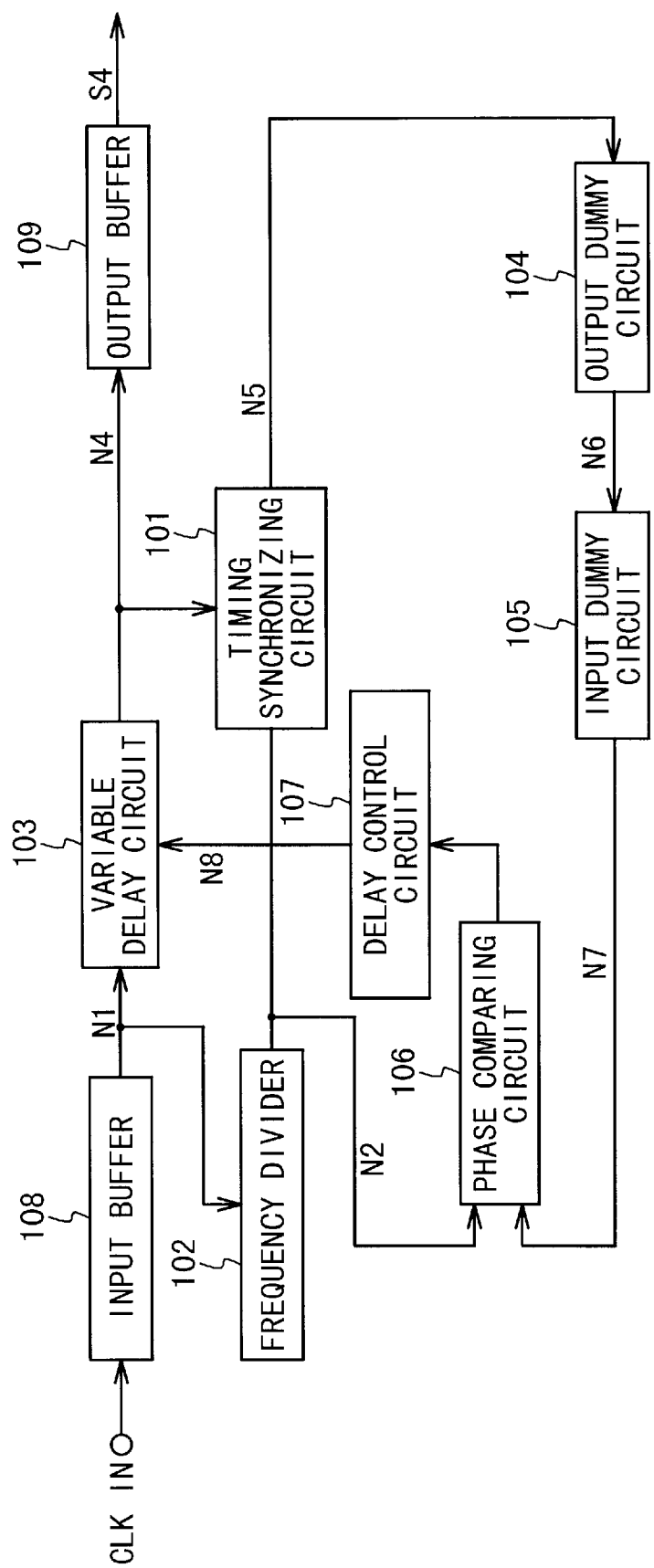
FIG. 1 is a block diagram showing the structure of a conventional DLL circuit.
Figures 2A, 2B, 2C, 2D, 2E:
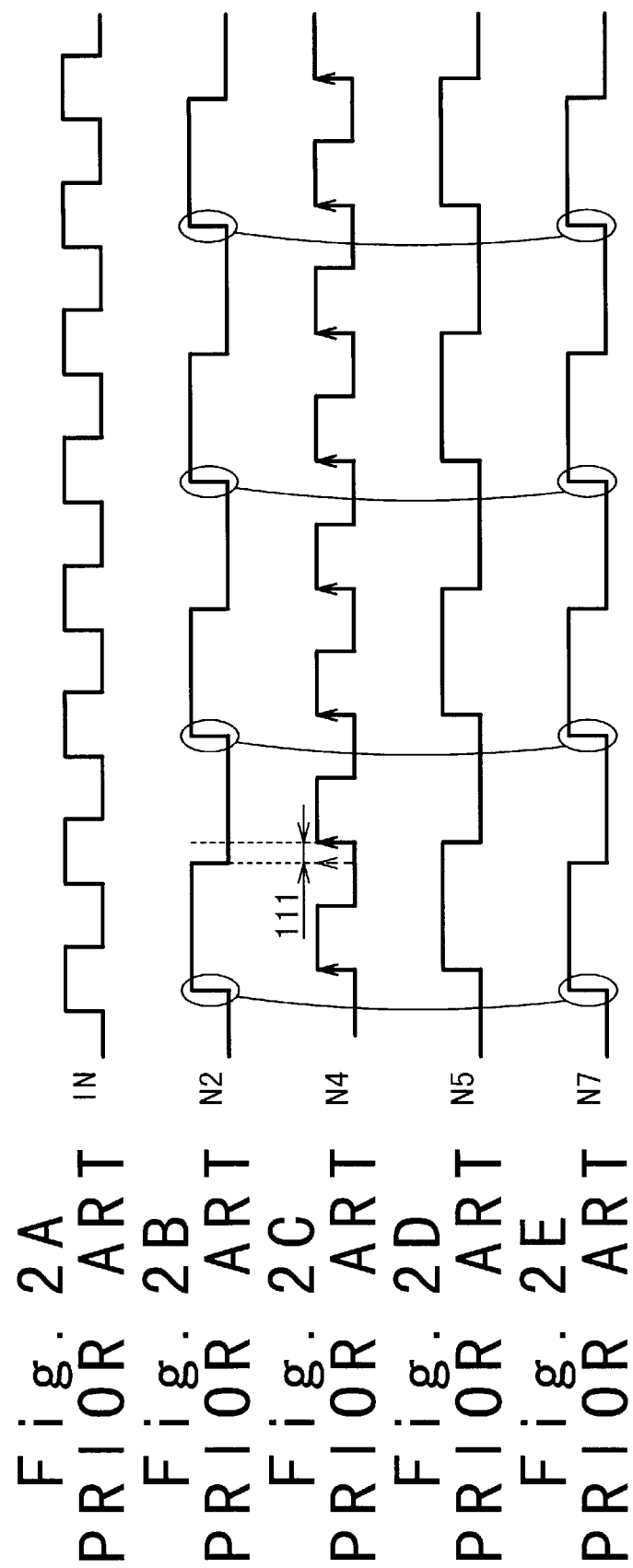
FIGS. 2A to 2E are timing charts showing the waveforms of signals in the conventional DLL circuit shown in FIG. 1.
Figure 3:
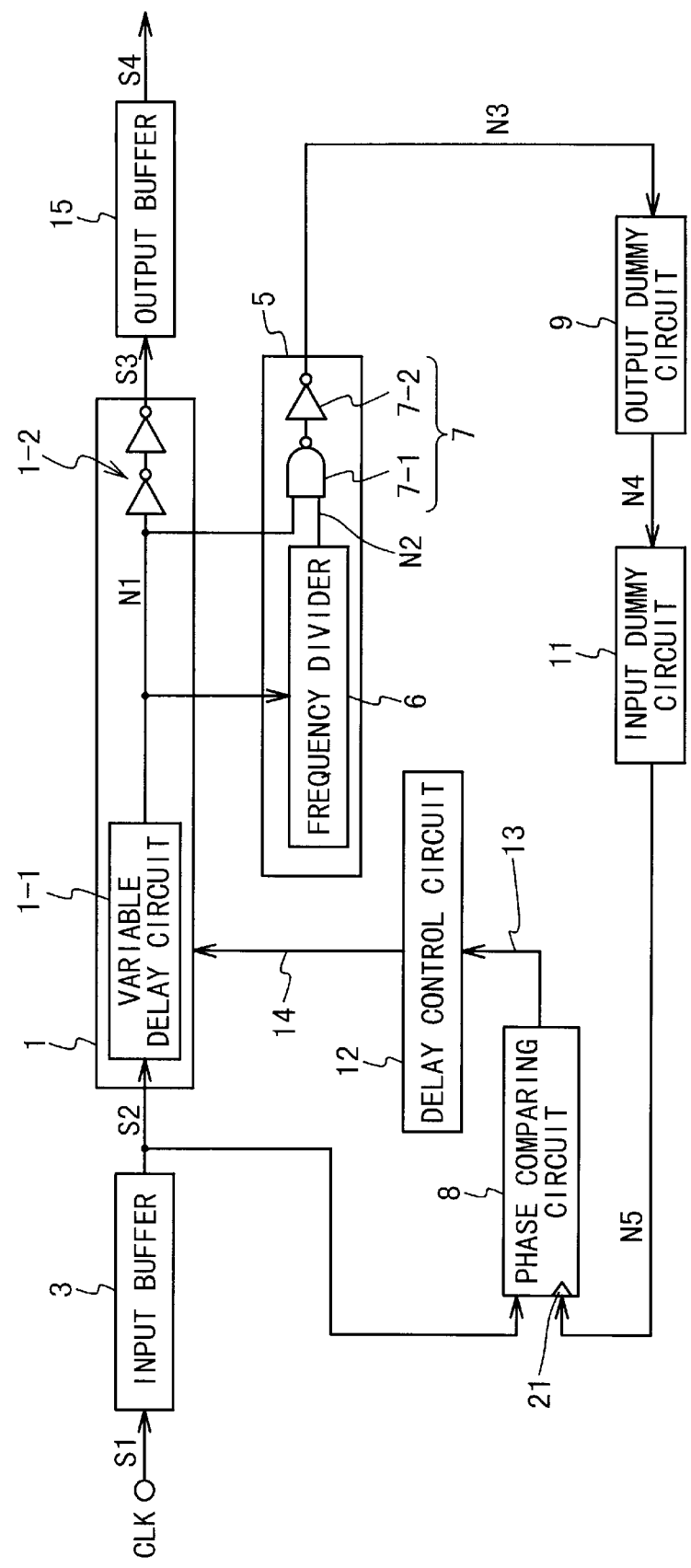
FIG. 3 is a block diagram showing the structure of a DLL circuit according to a first embodiment of the present invention.

FIG. 3 is a block diagram showing the structure of the semiconductor device according to the first embodiment of the present invention. First, referring to FIG. 3, the DLL circuit in the first embodiment of the present invention is composed of a signal propagation system and a delay control system.

The signal propagation system delays an external clock signal supplied thereto and generates an internal clock signal. The delay control system controls the delay quantity in the signal propagation system such that the phase of the external clock signal and the phase of the internal clock signal satisfy a predetermined relation.

The signal propagation system is composed of an input buffer 3, a delay circuit 1 and an output buffer 15. The delay circuit 1 is composed of a variable delay section 1-1 and a fixed delay section 1-2 having a predetermined delay quantity. The variable delay circuit 1 delays a signal based on an inputted delay control signal 14.

The delay control system is composed of a sampling circuit 5, an output dummy circuit 9, an input dummy circuit 11, a phase comparing circuit 8, and a delay control circuit 12. The sampling circuit 5 is composed of a control signal generating section 6 (a frequency divider in FIG. 3) which generates a sampling control signal, and a sampling section 7.

Next, an operation of the DLL circuit in the first embodiment of the present invention will be described.

Figure 4:
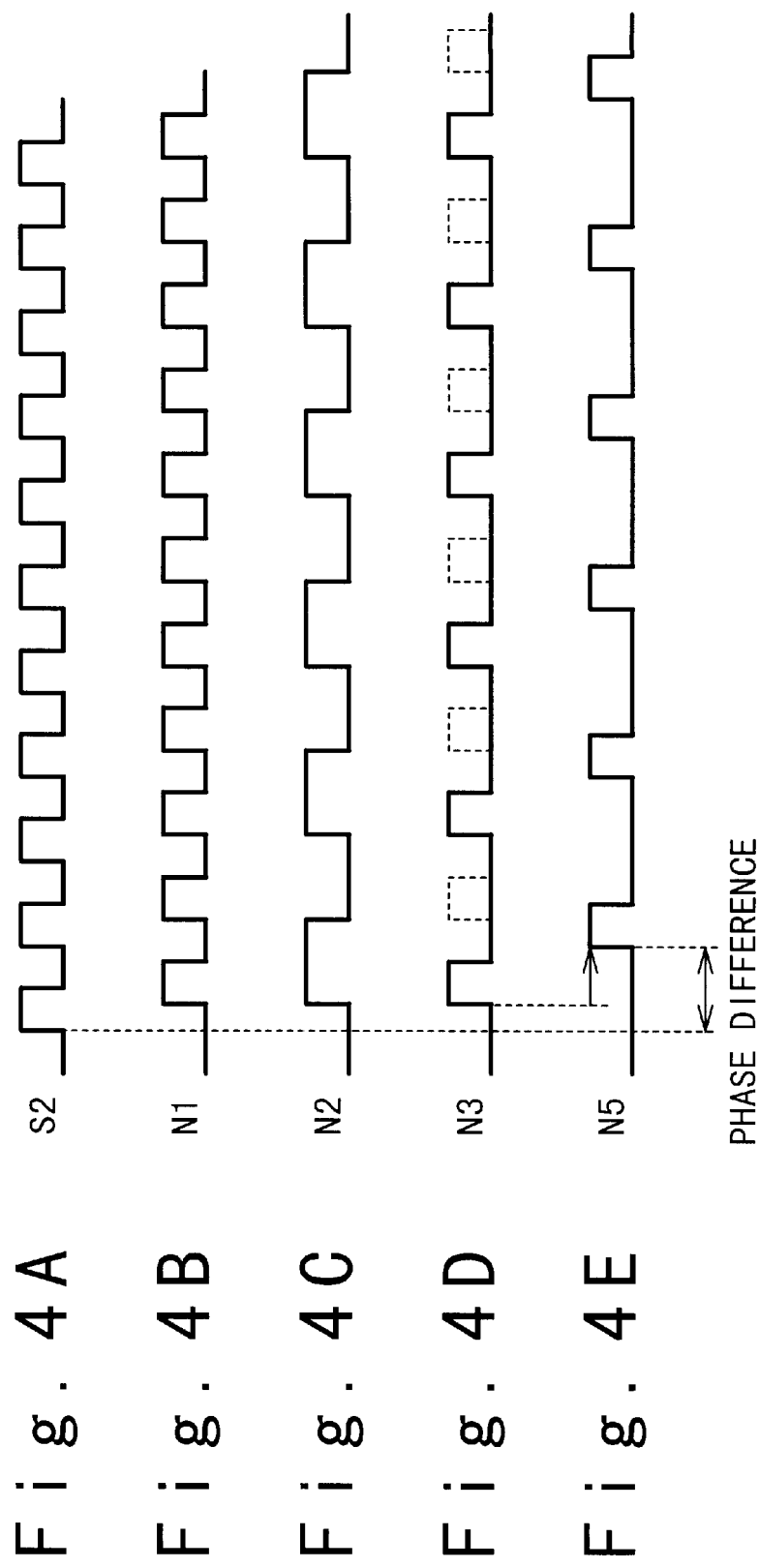
FIGS. 4A to 4E are timing charts showing the waveforms of signals in the DLL circuit according to the first embodiment of the present invention.

The input buffer 3 inputs an external clock signal S1 and outputs a reference clock signal S2 as shown in FIG. 4A. The Input buffer 3 has a peculiar delay quantity. Therefore, the reference clock signal S2 is delayed by the delay quantity from signal S1. The reference clock signal S2 is supplied to the delay circuit 1 and the phase comparing circuit 8.

The delay circuit 1 is composed of the variable delay circuit section 1-1 and the fixed delay section 1-2. The delay circuit section 1-1 inputs the signal S2, delays the signal S2 by the delay quantity determined based on the delay control signal 14, and outputs the delayed signal N1 as shown in FIG. 4B. The delayed signal N1 is outputted to the fixed delay section 1-2 and the sampling circuit 5. The fixed delay section 1-2 is composed of at least one delay element. The delay element may be a buffer or an inverter. The fixed delay section 1-2 inputs the delayed signal N1 and outputs the delayed signal S3 to the output buffer 5. The signal S3 is delayed by the delay quantity from the delayed signal N1 because the fixed delay section 1-2 has the fixed delay quantity.

The output buffer 15 inputs the delayed signal S3 and outputs an internal clock signal S4. The output buffer 15 has a peculiar delay quantity. Therefore, the internal clock signal S4 is delayed by the delay quantity from the signal S3. This internal clock signal S4 is used in a semiconductor device having the DLL circuit. For example, when the semiconductor device is a synchronous DRAM, control signals such as a read enable signal and a latch signal used in a memory section of the synchronous DRAM are generated using this internal clock signal S4.

The sampling circuit 5 is composed of the control signal generating section 6 and the sampling section 7. The sampling circuit 5 has a peculiar delay quantity. The delay quantity of the fixed delay section 1-2 of the delay circuit 1 is set to be equal to the delay quantity of the sampling circuit 5. Also, the sampling circuit 5 is provided in the front of the output dummy circuit 9 and the input dummy circuit 11 with respect to the delayed signal N3.

The control signal generating section 6 is composed of a frequency divider 6 in this example. The frequency divider 6 is a ½ frequency divider. Therefore, the frequency divider 6 divides the frequency of the signal N1 into ½ as shown in FIG. 4C, and outputs a frequency division signal N2. The signal N2 is supplied to the sampling section 7.

The sampling section 7 is composed of a NAND circuit 7-1 and an inverter 7-2 in this example. The sampling section 7 samples the signal N1 based on the signal N2 and generates the signal N3 as shown in FIG. 4D. When the signal N2 is in the H level, the signal N1 is outputted, and when the signal N2 is in the L level, the signal N1 is not outputted. In this way, one is selected from every two pulses of the signal N1.

This is because the frequency divider 6 is ½ frequency divider. One may be outputted from n (n is an integer more than 1) pulses of the signal N1. In this case, a 1/n frequency divider should be used.

The output dummy circuit 9 has the delay quantity equal to the output buffer 15. Also, the input dummy circuit 11 has the delay quantity equal to that of input buffer 3. Therefore, the signal N3 is delayed by the output dummy circuit 9 so that the signal N4 is generated, and the signal N4 is delayed by the input dummy circuit so that the signal N5 is generated. The signal N5 is shown in FIG. 4E. The signal N5 is supplied to the phase comparing circuit 8.

In this way, the signal N5 reflects the delay quantity of the input buffer 3 and the delay quantity of the output buffer 15 in addition to the fixed delay section 1-2. In this example, the output dummy circuit 9 and the input dummy circuit 11 are separately provided. However, these dummy circuits may be provided as a unit. Also, each of the input dummy circuit 11 and the output dummy circuit 9 consumes large current when the level of the input signal changes. However, because the number of pulses of the signal N3 is reduced to ½ by the sampling circuit 5 in this example, the current consumption becomes ½, compared with the case to use the signal N1 just as it is.

The phase comparing circuit 8 detects the lead or delay of the phase of the signal S1 with respect to the phase of the signal N5. In detail, the phase comparing circuit 8 receives the signal N5 at a clock signal terminal 21. With this, the phase comparing circuit 8 takes in the signal S2 in synchronism with the rising edge of the signal N5. In this way, the phase comparing circuit 8 detects the lead or delay of the phase of the signal S1 with respect to the phase at the rising edge of the signal N5. The phase comparing circuit 8 outputs a detection result to the delay control circuit 12 as a signal 13. The delay control circuit 12 generates the delay control signal 14 based on the signal 13 and outputs it to the variable delay circuit 1. In this way, the delay quantity of the delay circuit 1 is controlled in such a manner that that the phase of the internal clock signal S4 is coincident with the phase of the external clock signal S1.

The timing synchronizing operation between the delay signal and the divided signal caused the above erroneous operation in the conventional example. However, in the present invention, such a timing synchronizing operation does not have to be carried out. Accordingly, a stable operation is achieved. Also, the signal N5 is used for the reference of the phase comparing operation. Therefore, the phases can be compared between the signals of different frequencies. This is because the sampled signal is used for the reference. For this reason, the object of the phase comparison always exists, i.e., there is any case of no object.

Next, a semiconductor device in the second embodiment of the present invention will be described with reference to FIG. 5. The semiconductor device of the second embodiment has the structure similar to the semiconductor device of the first embodiment. The different point is in a part of the frequency divider, the sampling circuit 6 and the delay circuit 1 of the first embodiment.

Figure 5:
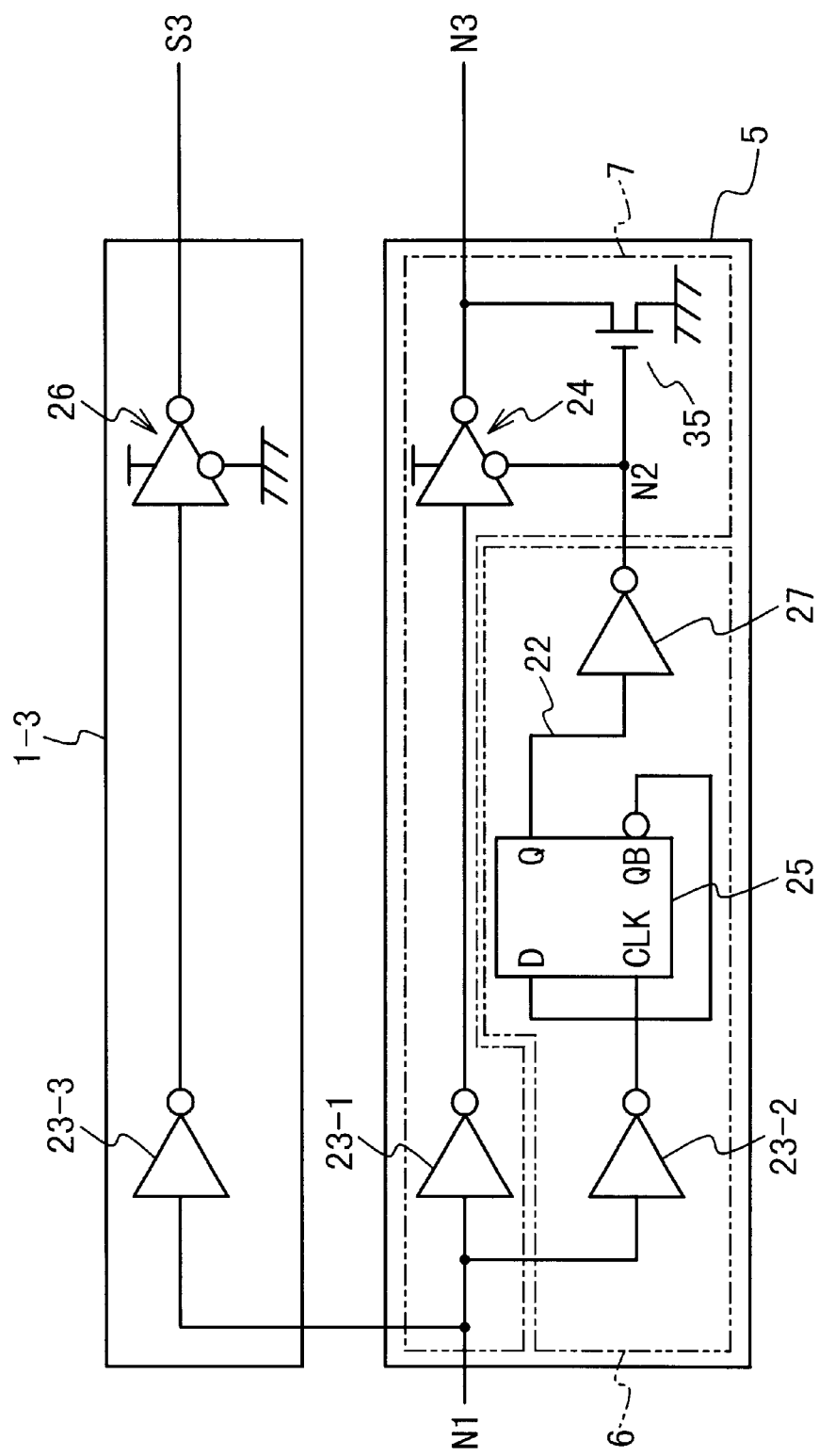
FIG. 5 is a block diagram showing the structure of the DLL circuit according to a second embodiment of the present invention.

Referring to FIG. 5, a second buffer section 1-3 is used in place of the buffer section 1-2 in the delay circuit 1. The second buffer section 1-3 is composed of an inverter 23-3 and a clocked inverter 26. The frequency divider 6 is composed of an inverter 23-2, a D-type flip prop 25 and an inverter 27. The sampling section 7 is composed of an inverter 23-1, an inverter 24 with a control terminal, and an N channel MOSFET 35.

Next, the DLL circuit in the second embodiment of the present invention will be described. FIG. 5 shows the structure of the DLL circuit according to the second embodiment of the present invention and FIGS. 6A to 6E show a waveform of each section of the DLL circuit in the second embodiment. The DLL circuit in the second embodiment differs from the DLL circuit in the first embodiment in the fixed delay section 1-3 of the variable delay circuit 1 and the sampling circuit 5. The other elements are the same. Therefore, only a different point will be described.

Referring to FIG. 5, in the sampling circuit 5 of the second embodiment, the control signal generating section 6 is composed of an inverter 23-2, a D-type flip-flop 25, and an inverter 27. The inverter 23-2 is connected with the signal N1. The output of the inverter 23-2 is supplied to the clock signal terminal of the D-type flip-flop 25. The inversion signal of the QB output of the flip-flop 25 is connected with the D input terminal. The Q terminal output of the flip-flop 25 is outputted to the inverter 27.

The sampling section 7 is composed of an inverter 23-1, a clocked inverter 24, and an N channel FET 35. The inverter 23-1 is connected with the signal N1. The output of the inverter 23-1 is connected with the clocked inverter 24. The delay due to the inverter 23-2 is canceled by this inverter 23-1. The clock signal terminal of the clocked inverter 24 is connected with the output of the above inverter 27. The output of the clocked inverter 24 is connected with the drain of the N channel FET 35. The gate of the N channel FET 35 is connected with the output of the above inverter 27 and the source is grounded.

Also, the fixed delay section 1-3 is composed of an inverter 23-3 and a clocked inverter 26. The inverter 23-3 is connected with the signal N1 and its output is connected with the clocked inverter 26. The clock signal terminal of the clocked inverter 26 is grounded.

The delay quantity of the fixed delay section 1-3 and the delay quantity of the sampling circuit 5 must be equalized. Therefore, the delay quantity of the inverter 23-1 is equal to that of the inverter 23-2 and also the delay quantities of clocked inverters 24 and 26 are same.

Next, referring to FIGS. 6A to 6E, the operation of the DLL circuit in the second embodiment will be described.

Figure 6:
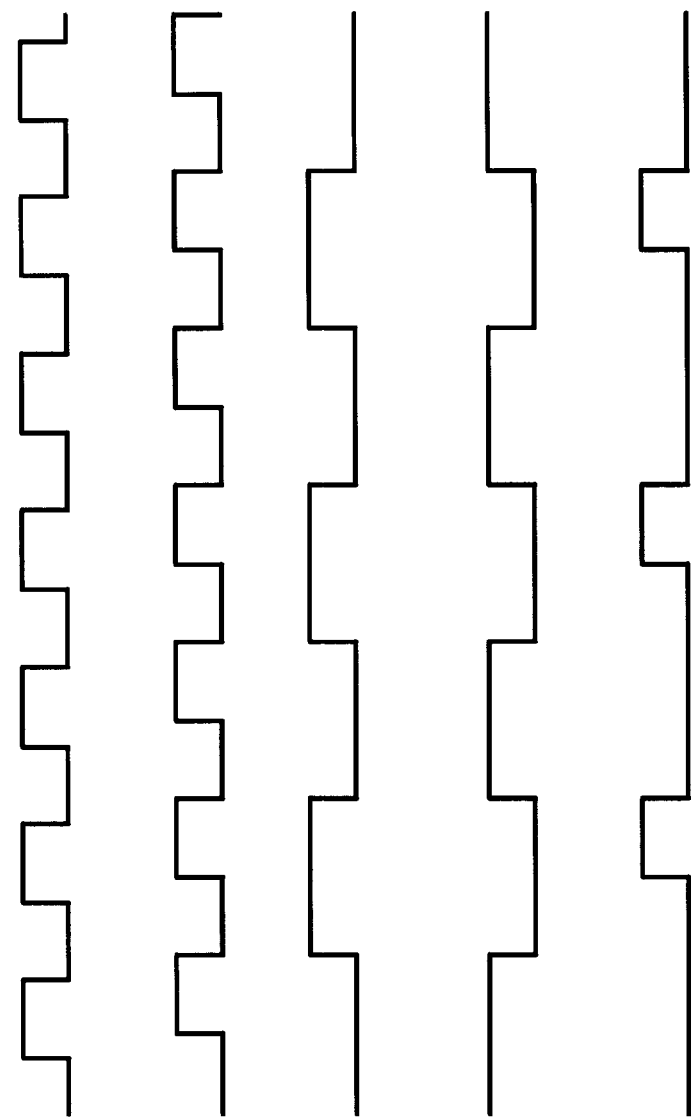
FIGS. 6A to 6E are timing charts showing the waveforms of signals in the DLL circuit according to the second embodiment of the present invention.

The signal N1 shown in FIG. 6A is delayed and inverted by the inverter 23-2, and then supplied to the flip-flop 25. The flip-flop 25 divides the frequency of the delayed signal N1 to have ½ of the frequency of the delayed signal N1 and outputs the signal 22 shown in FIG. 6C. The inverter 27 inverts the signal 22 to generate the signal N2 shown in FIG. 6D.

At this time, the signal N1 is inverted by the inverter 23-1 which has the same delay time as the inverter 23-2, and is supplied to the clocked inverter 24. When the output of the inverter 27 is in the H level, the clocked inverter 24 is turned off. Therefore, any signal is not outputted from the inverter 23-1. Also, the N channel FET 35 is turned on and the output of the clocked inverter 24 goes to an L level.

On the other hand, when the output of the inverter 27 is in an L level, the clocked inverter 24 is turned on. Therefore, a signal from the inverter 23-1 is inverted and outputted by the clocked inverter 24. Also, because the N channel FET 35 is turned off, the output of the clocked inverter 24 is outputted just as it is, as the signal N3.

Also, the signal N1 is inverted by the inverter 23-3 and is outputted to the clocked inverter 26. Because the clock signal terminal of the clocked inverter 26 is grounded, an output from the inverter 23-3 is inverted and is outputted as a signal S3.

As mentioned above, one of every two of the pulses of the signal N1 is outputted as the signal N3 from the sampling circuit 5. In the second embodiment, the delay quantity can be more strictly adjusted between the signal delay path (the signal N1, the inverter 23-3, the clocked inverter 26, and the signal S3) and the sampling path (the signal N1, the inverter 23-1, the clocked inverter 24 and the signal N3), compared with the first embodiment.

It should be noted that in the first and second embodiments, the phase comparison is carried out using the signals having different frequencies but the same input waveform. As a result, the precision of detection of a phase difference can be improved.

Figure 7:
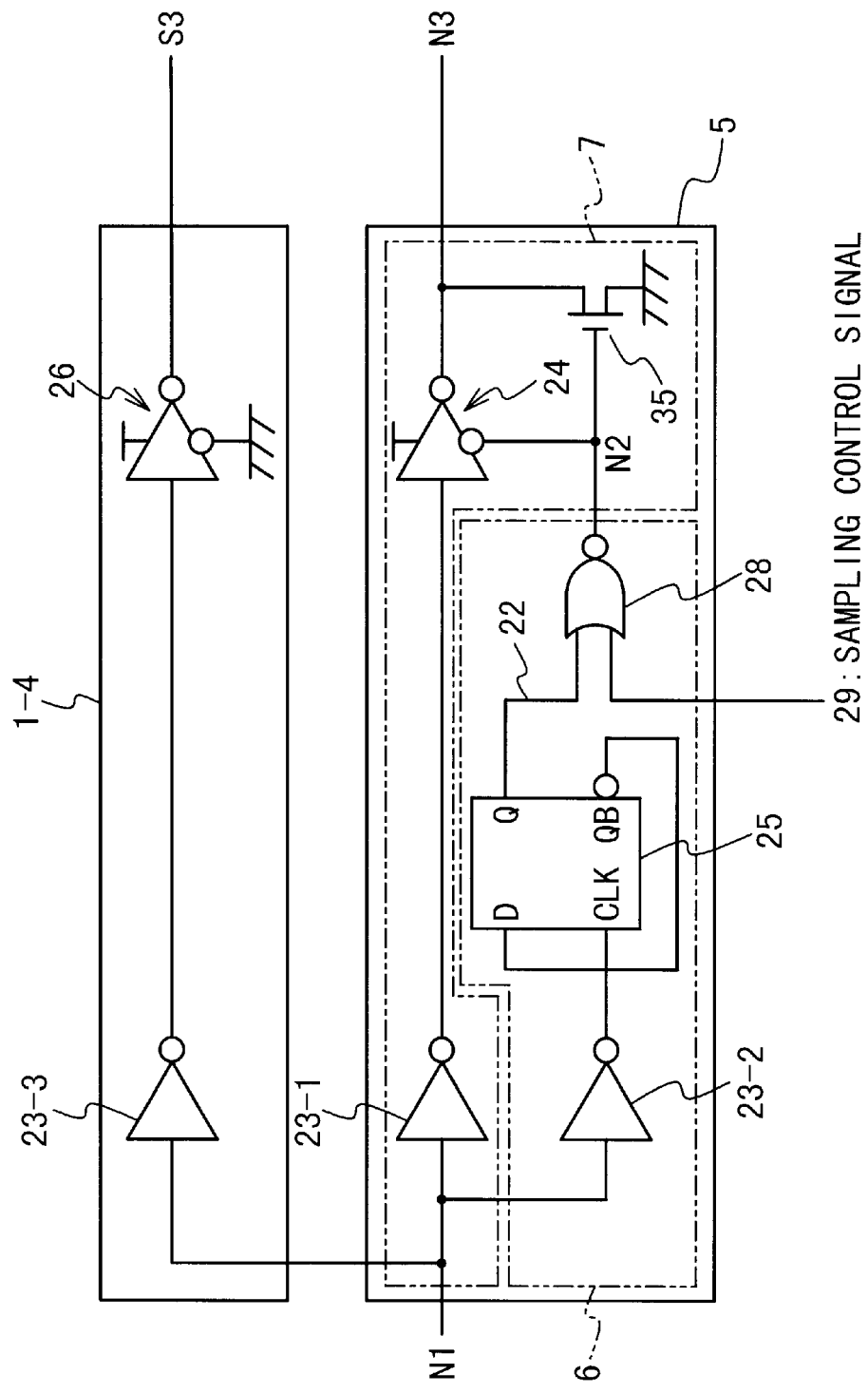
FIG. 7 is a block diagram showing the structure of the DLL circuit according to a third embodiment of the present invention.

Next, the DLL circuit according to the third embodiment of the present invention will be described. FIG. 7 shows the structure of the DLL circuit according to the third embodiment of the present invention, and FIGS. 8A to 8E show waveform diagrams at various sections of the DLL circuit in the third embodiment. The DLL circuit in the third embodiment differs from the DLL circuit in the first embodiment in the fixed delay section 1-4 of the delay circuit 1 and the sampling circuit 5. The other elements are same. Therefore, only a different point will be described.

Referring to FIG. 7, at the sampling circuit 5 of the third embodiment, the control signal generating section 6 is composed of an inverter 23-2, a D-type flip-flop 25, and a NOR circuit 28. The inverter 23-2 is connected with the signal N1. The output of the inverter 23-2 is supplied to the clock signal terminal of the D-type flip-flop 25. The inversion signal of the QB output of the flip-flop 25 is connected with the D input terminal. The Q terminal output of the flip-flop 25 is outputted to the NOR circuit 28. A sampling control signal 29 is externally supplied to the NOR circuit 28.

The sampling section 7 is composed of an inverter 23-1, a clocked inverter 24, and an N channel FET 35. The inverter 23-1 is connected with the signal N1. The output of the inverter 23-1 is connected with the clocked inverter 24. The clock signal terminal of the clocked inverter 24 is connected with the output of the NOR circuit 28. The output of the clocked inverter 24 is connected with the drain of the N channel FET 35. The gate of the N channel FET 35 is connected with the output of the above NOR circuit 28, and the source is grounded.

Also, the fixed delay section 1-4 is composed of an inverter 23-3 and a clocked inverter 26. The inverter 23-3 is connected with the signal N1 and its output is connected with the clocked inverter 26. The clock signal terminal of the clocked inverter 26 is grounded.

In the third embodiment, the delay quantity can be more strictly adjusted between the signal delay path (the signal N1, the inverter 23-3, the clocked inverter 26 and the signal S3) and the sampling path (the signal N1, the inverter 23-1, the clocked inverter 24 and the signal N3), compared with the first embodiment.

Next, referring to FIGS. 8A to 8E, the operation of the DLL circuit of the third embodiment will be described.

Figure 8:
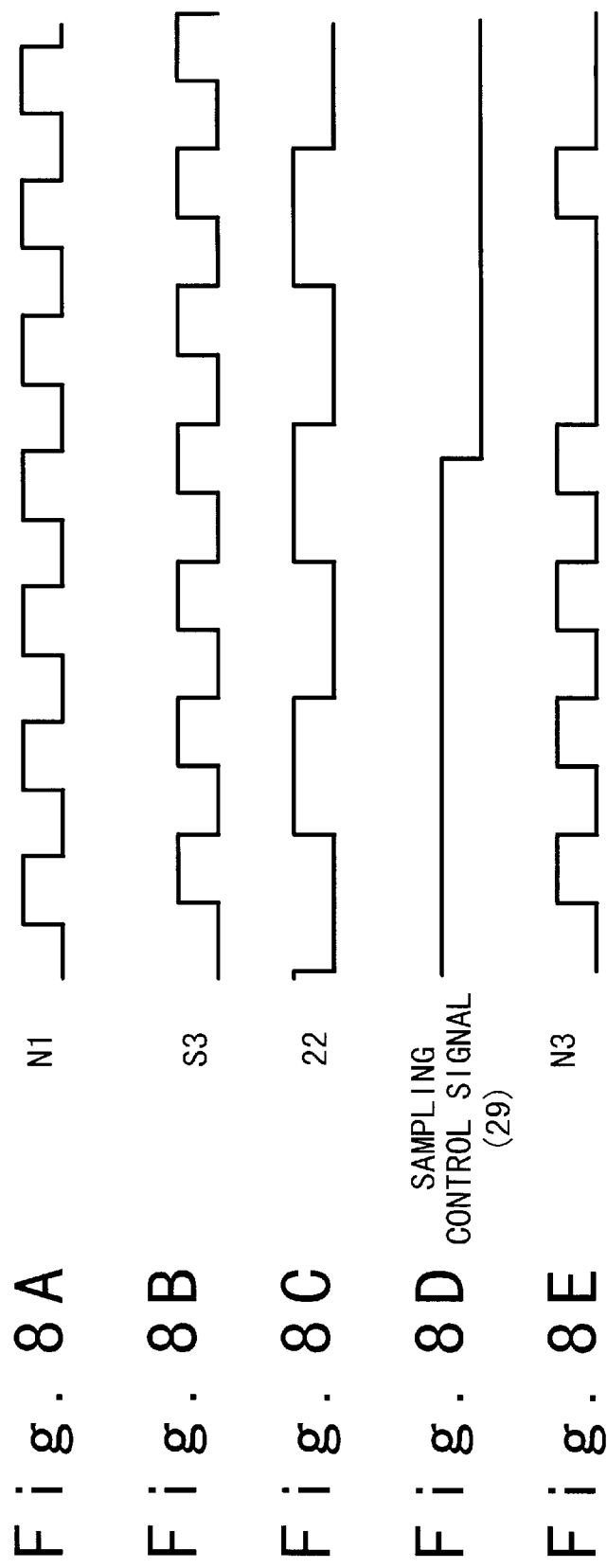
FIGS. 8A to 8E are timing charts showing the waveforms of signals in the DLL circuit according to the third embodiment of the present invention.

The signal N1 shown in FIG. 8A is delayed and is inverted by the inverter 23-2, and is supplied to the flip-flop 25. The flip-flop 25 divides the delayed signal N1 in frequency to have a frequency of ½ and outputs the signal 22 shown in FIG. 8C.

At this time, the signal N1 is inverted by the inverter 23-1 which has the same delay time as that of the inverter 23-3, and then is supplied to the clocked inverter 24. When the sampling control signal is in the H level, the output of the NOR circuit 28 goes to the L level so that the clocked inverter 24 is turned on. Therefore, a signal from the inverter 23-1 is inverted and is outputted as the signal N3 having the same delay equal as that of the signal S3. Also, because the N channel FET is turned off, there is no influence to the operation of the clocked inverter 24.

On the other hand, when the sampling control signal is in the L level, the output of the NOR circuit 28 goes to the L level so that the clocked inverter 24 is turned on, if the output of the flip-flop 25 is in the H level. Therefore, a signal from the inverter 23-1 is inverted and is outputted as the signal N3 having the same delay as that of the signal S3. Also, because the N channel FET is turned off, there is no influence to the operation of the clocked inverter 24. However, when the sampling control signal is in the L level, the output of the NOR circuit 28 goes to the H level, so that the clocked inverter 24 is turned off, if the output of the flip-flop 25 is in the L level. Therefore, a signal from the inverter 23-1 is not outputted. Also, because the N channel FET is turned on, the output of the clocked inverter 24 is set to the L level.

Also, the signal N1 is inverted by the inverter 23-3 having a delay quantity equal to or larger than that of the inverter 23-2 and is outputted to the clocked inverter 26. The clock signal terminal of the clocked inverter 26 is grounded. Therefore, the output from the inverter 23-3 is inverted and is outputted as a signal S3. As mentioned above, one is selected from every two pulses of the signal N1 and is outputted as the signal N3 from the sampling circuit 5.

It should be noted that if a NAND circuit is used in place of the NOR circuit 28, The inverted signal of the signal N1 is inverted and is outputted in case of the signal 22 of the H level, when the sampling control signal is in the H level. When the sampling control signal is in the L level, the inverted signal of the signal N1 is not outputted regardless of the signal 22.

In this way, in the third embodiment, the sampling control signal is controlled such that the frequency division is not carried out when the external clock signal and the internal clock signal is unlocked, i.e., when the phase difference between the external clock signal and the internal clock signal is out of a predetermined range. Accordingly, the signal N1 is outputted just as it is, although having a delay. As a result, the phase comparison is carried out more than the number of times of the phase comparison when the frequency division is carried out. Therefore, the locked state is achieved in short time. After that, because the frequency division is carried out, the locked state is maintained while suppressing current consumption. Therefore, according to the third embodiment, the DLL circuit can operate stably, immediate after the DLL circuit is started, i.e., during the period from the unlocked state (the phase difference between the external clock signal and the internal clock signal does not fall within the predetermined range) to the locked state.

Figure 9:
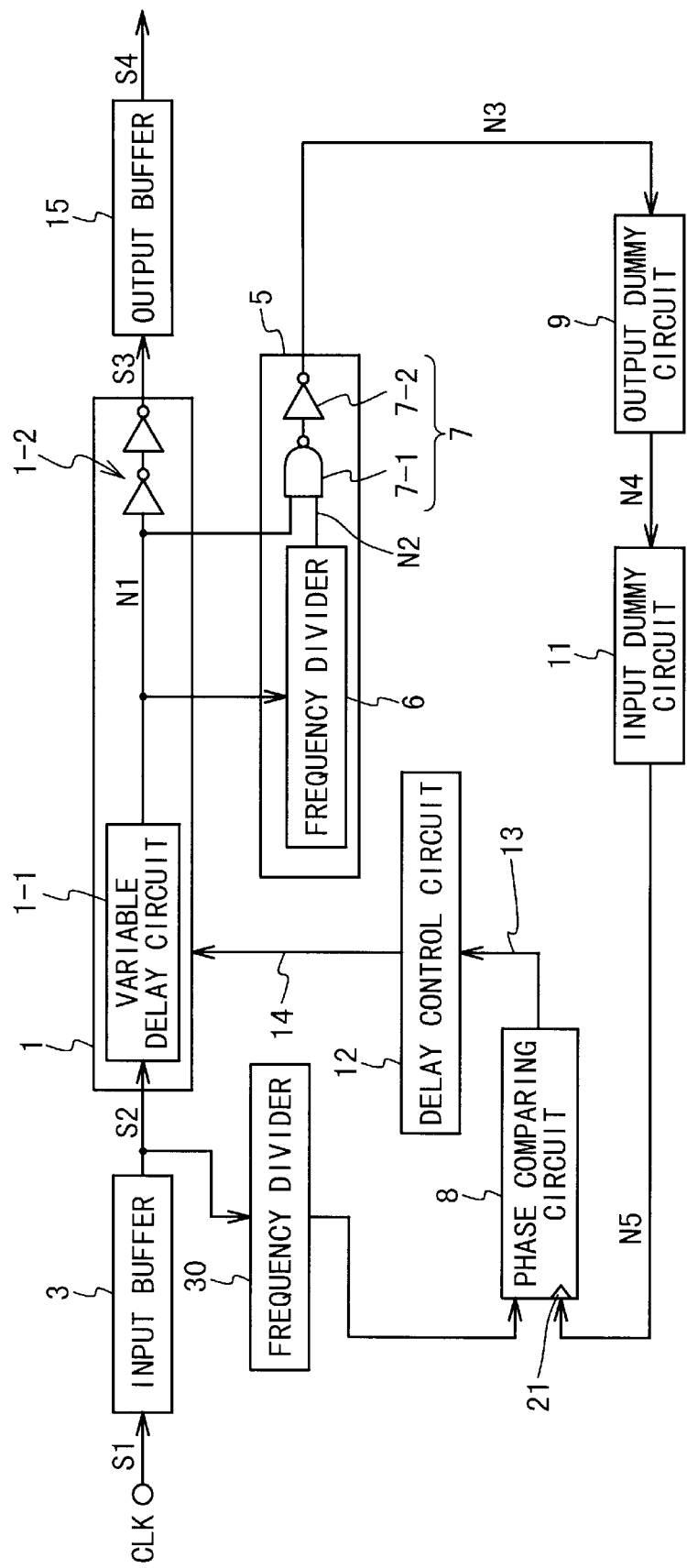
FIG. 9 is a block diagram showing the structure of the DLL circuit according to a fourth embodiment of the present invention.

Next, the DLL circuit according to the fourth embodiment of the present invention will be described, with reference to FIG. 9.

The DLL circuit in the fourth embodiment is different from the DLL circuit in the first embodiment in the following points. That is, the signal S2 is not directly supplied to the phase comparing circuit 8, and is frequency-divided by the frequency divider 30 and then is supplied to the phase comparing circuit 8. It supposes that the frequency divider 6 of the sampling circuit 5 is a 1/n frequency divider (n is an integer equal to or more than 2), i.e., the sampling circuit 5 outputs one of every n pulses of the signal N1. In this case, the frequency divider 30 is a 1/m frequency divider. Here, m is a divisor of n other than 1. Because the DLL circuit in the fourth embodiment is same as the DLL circuit in the first embodiment except this, the description is omitted.

In the fourth embodiment, even when the frequency of the reference clock signal exceeds an operation limit of the phase comparing circuit, the frequency of the reference clock signal can be reduced through the frequency division. That is, the operation possible frequency range can be widened.

Figure 10:
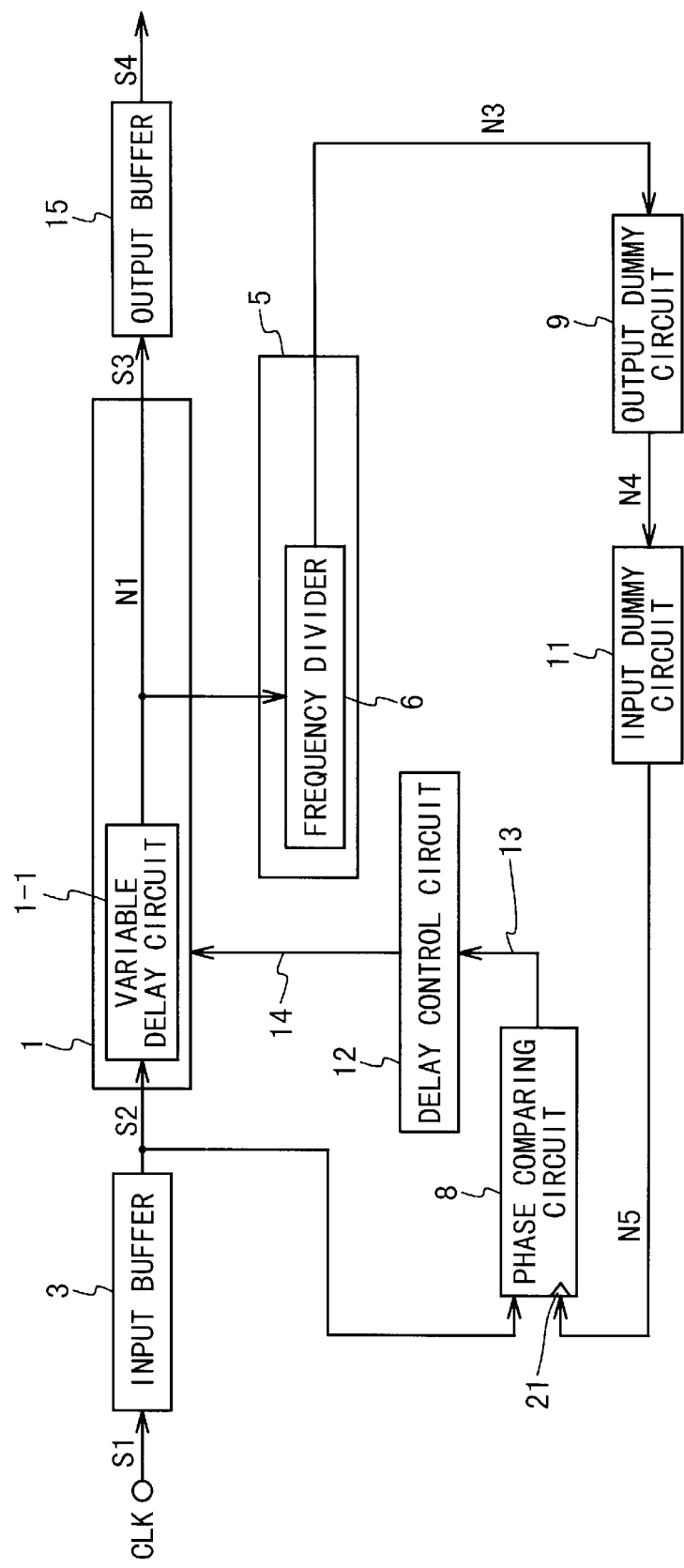
FIG. 10 is a block diagram showing the structure of the DLL circuit according to a fifth embodiment of the present invention.

Next, the DLL circuit according to the fifth embodiment of the present invention will be described with reference to FIG. 10.

The DLL circuit in the fifth embodiment is different from the DLL circuit in the first embodiment in the following points. That is, a fixed delay section is omitted and an output of the variable delay section 1-1 is supplied to the output buffer 15 as the signal S3. Also, in the sampling circuit 5, the sampling section 7 is omitted and the output of the frequency divider 6 is supplied to the output dummy circuit 9 just as it is as the signal N3. The DLL circuit in the fifth embodiment is same as the DLL circuit in the first embodiment except this.

In the fifth embodiment, the pulse of the frequency division signal N3 corresponds to one of the pulses from the variable delay section 1-1. That is, when the frequency divider 6 divides a 1/n frequency divider (n is a positive integer), the pulse corresponding to one of the n pulses of the signal N1 is outputted as the signal N3. In this way, while the number of circuit elements is reduced, the same effect as the first embodiment can be achieved.

The DLL circuit described above is generally incorporated into a semiconductor device such as a semiconductor memory, and a CPU. In this case, the internal clock signal S4 which is subjected to the phase control is used for the control of the timing of outputs of read data from the output buffer 109.

The DLL circuit of the present invention does not become a meta-stable and the phase control is stable.

Also, in the DLL circuit of the present invention, the sampling circuit is inserted in front of the dummy circuit so that the number of times of the phase comparing operation is reduced. Accordingly, little power consumption is attained.

Moreover, the phase comparing operation is carried out based on the sampled signal. Accordingly, the occurrence of an erroneous operation is restrained and a stable circuit operation is attained.

What is claimed is:

1. A DLL (delay locked loop) circuit comprising a signal propagation system and a delay control system, and
   wherein said signal propagation system comprises:
   a delay circuit which delays a reference clock signal based on a delay control signal to generate a delayed clock signal, and
   said delay control system comprises:
   a sampling circuit which outputs a first clock signal having a pulse corresponding to one of n (n is an integer more than 1) pulses of said delayed clock signal;
   a phase comparing circuit which compares said first clock signal as a first comparison input signal and said reference clock signal as a second comparison input signal in phase to output a phase difference; and
   a delay control circuit which generates said delay control signal based on said phase difference from said phase comparing circuit to output to said delay circuit of said signal propagation system, wherein said sampling circuit comprises:
   a frequency divider which divides a frequency of said delayed clock signal into 1/n to generate a division signal; and
   a selection output circuit which selectively outputs a pulse corresponding to each of said pulses of said delayed clock signal based on said division signal.

2. The DLL circuit according to claim 1, wherein said selection output circuit comprises:
   a clocked inverter connected with an output of said frequency divider to invert said delayed clock signal; and
   an N-channel transistor having a gate terminal connected with an output of said frequency divider, a drain terminal connected with an output of said clocked inverter and a source terminal grounded.

3. The DLL circuit according to claim 1, wherein said frequency divider comprises:
   a flip-flop which divides the frequency of said delayed clock signal into ½; and
   an inverter which inverts an output of said flip-flop.

4. The DLL circuit according to claim 1, wherein said frequency divider comprises:
   a flip-flop which divides the frequency of said delayed clock signal into ½; and
   a NOR circuit which outputs a NOR operation result of an output of said flip-flop and a sampling control signal, and
   said sampling control signal is in an L level normally and is in a H level in an active state, and indicates whether said delay signal should be outputted in synchronism with said division signal or continuously.

5. A delay control method comprising the steps of:
   (a) generating a reference clock signal from an external clock signal supplied via an input buffer;
   (b) delaying said reference clock signal based on a delay control signal to generate a delayed clock signal;
   (c) outputting said delayed clock signal via an output buffer;
   (d) sampling a pulse corresponding to one of n (n is an integer more than 1) pulses of said delayed clock signal to output a first clock signal;
   (e) delaying said first clock signal by a summation of a delay quantity of said input buffer and a delay quantity of said output buffer to generate a second clock signal;
   (f) comparing said second clock signal as a first comparison input signal and said reference clock signal as a second comparison input signal in phase to output a phase difference; and
   (g) generating said delay control signal based on said phase difference, wherein said (d) sampling step comprises the steps of:
   dividing a frequency of said delayed clock signal into 1/n to generate a division signal; and
   selectively outputting a pulse corresponding to each of said pulses of said delayed clock signal based on said division signal.

* * * * *